United States Patent [19]
Tang et al.

[11] Patent Number: 5,294,870
[45] Date of Patent: Mar. 15, 1994

[54] ORGANIC ELECTROLUMINESCENT MULTICOLOR IMAGE DISPLAY DEVICE

[75] Inventors: Ching W. Tang, Rochester; David J. Williams, Fairport; Jack C. Chang, Rochester, all of N.Y.

[73] Assignee: Eastman Kodak Company, Rochester, N.Y.

[21] Appl. No.: 814,553

[22] Filed: Dec. 30, 1991

[51] Int. Cl.$^5$ .................................. H05B 33/14
[52] U.S. Cl. ................................ 313/504; 313/505; 315/169.3; 428/917; 345/76
[58] Field of Search .......... 313/486, 487, 489, 500, 313/504, 505, 506, 496; 428/690, 917; 340/781, 760; 315/169.3

[56] References Cited

U.S. PATENT DOCUMENTS

| 4,446,399 | 5/1984 | Endo et al. | 313/505 |
| 4,999,539 | 3/1991 | Coovert et al. | 313/505 |

FOREIGN PATENT DOCUMENTS 349265 1/1990 European Pat. Off. ..... H05B 33/26

OTHER PUBLICATIONS

Batchelder et al, Luminescent Solar Concentrators. 2: Experimental and Theoretical Analysis of Their Possible Efficiencies, Applied Optics vol. 21, No. 21, Nov. 1991, pp. 3733-3754.

R. Mach and G. O. Mueller, "Physics and Technology of Thin Film Electroluminescent Displays", Semicond. Sci. Technol. 6 pages: 305-323; Dec. 1990.

Primary Examiner—Donald J. Yusko
Assistant Examiner—Ashok Patel
Attorney, Agent, or Firm—Robert L. Walker

[57] ABSTRACT

An organic electroluminescent multicolor image display device is disclosed containing an image display array made up of a plurality of light emitting pixels arranged in intersecting files (rows and columns). Each pixel contains a light transmissive first electrode, an electroluminescent medium overlying the first electrode, and an overlying second electrode. The electrodes connect the pixels in an X-Y addressing pattern. The organic electroluminescent medium emits in the blue region of the spectrum. Each pixel is divided into at least two sub-pixels. The electrodes of one set of parallel files is divided into at least two laterally spaced elements each of which joins and forms a part of one sub-pixel of each pixel in the same file. A fluorescent medium capable of absorbing light emitted by the electroluminescent medium and emitting at a longer wavelength is positioned to receive emitted light from the first electrode means. The fluorescent medium is confined to only one of the sub-pixels of each pixel.

11 Claims, 4 Drawing Sheets

ORGANIC ELECTROLUMINESCENT MULTICOLOR IMAGE DISPLAY DEVICE

FIELD OF THE INVENTION

The invention is directed to an organic electroluminescent image display device and to a process for its fabrication.

RELATED PATENT APPLICATION

Tang U.S. Ser. No. 07/814,512, filed concurrently herewith and commonly assigned, titled ORGANIC ELECTROLUMINESCENT IMAGE DISPLAY DEVICE AND PROCESS FOR ITS FABRICATION, discloses a device and a process for its preparation in which walls are interposed between a support and an organic EL medium to create a pattern of overlying electrodes.

PRIOR ART

Scozzafava EP 349,265 (a patent application published by the European Patent Office on Jan. 3, 1990) discloses an organic electroluminescent image display device and a process for its fabrication.

Scozzafava discloses a glass support bearing a series of laterally spaced, parallel indium tin oxide anode strips. An organic electroluminescent medium overlies the anode strips. Laterally spaced, parallel cathode strips, orthogonally oriented relative to the anode strips, are formed over the organic electroluminescent medium by depositing cathode forming metal as a continuous layer followed by patterning. Patterning of the cathode layer into cathode strips is achieved by spin coating a solution of monomeric negative-working photoresist in 2-ethoxyethanol solvent. The photoresist is imagewise exposed to uv radiation to produce a pattern of crosslinking, and uncrosslinked photoresist is removed by dipping the array in 2-ethoxyethanol for a few seconds. This removes unexposed photoresist and uncovers areas of the cathode layer. The uncovered areas of the cathode layer are removed by dipping the array in an acid etch bath consisting of 1000:1 water:sulfuric acid solution. After producing the cathode strips by this procedure, the array is rinsed in water and spun to remove excess water.

R. Mach and G. 0. Mueller, "Physics and Technology of Thin Film Electroluminescent Displays", *Semicond. Sci. Technol.* 6 (1991) 305–323, reviews the physics of thin film electroluminescent devices (TFELD) constructed using inorganic luminescent materials. In FIG. 20 a full color pixel construction is shown in which patterned blue, green and red emitting inorganic layers form sub-pixels. An alternative full color pixel construction employs a white inorganic emitter in combination with a color filter array containing pixels patterned into blue, green and red transmitting subpixels.

SUMMARY OF THE INVENTION

In one aspect this invention is directed to a light emitting device comprised of an image display array consisting of a plurality of light emitting pixels arranged in two intersecting sets of parallel files, the pixels in a first set of parallel files forming columns and the pixels in a second set of parallel files forming rows. Each pixel in the same file of one set of parallel files contains and is joined by a common light transmissive first electrode means. The first electrode means in adjacent files of the one set is laterally spaced. An organic electro-luminescent medium overlies the first electrode means. Each pixel in the same file of the remaining set of parallel files contains and is joined by a common second electrode means located on the organic electroluminescent medium, and the second electrode means in adjacent files of the remaining set is laterally spaced on the organic electroluminescent medium.

The invention is characterized in that the light emitting device is capable of multicolor image display. The organic electroluminescent medium emits in the blue region of the spectrum and has a peak emission at a wavelength of less than 480 nm. Each pixel is divided into at least two sub-pixels. In each file of pixels of a selected set one of said first and second electrode means is divided into at least two laterally spaced elements, each of the electrode elements joining and forming a part of one sub-pixel of each pixel in the same file, and a fluorescent medium capable of absorbing light emitted by the organic electro-luminescent medium and emitting at a longer wavelength is positioned to receive emitted light transmitted from the organic electroluminescent medium through the first electrode means, the fluorescent medium forming a part of only one of the sub-pixels of each pixel.

The multicolor organic electroluminescent image display devices of the invention can exhibit operating characteristics comparable to those of otherwise similar organic electroluminescent devices lacking an image display capability. The devices of the invention require no post deposition patterning either of the organic electroluminescent medium or overlying electrodes to produce a multicolor imaging capability and thereby avoid the degradation of efficiency and stability resulting from post deposition patterning procedures.

The multicolor organic electroluminescent image display devices of the invention are also more efficient than devices that emit white light and depend on a patterned color filter array for a multicolor imaging capability. Assuming an ideal system in which white light is emitted that is uniform in intensity throughout the visible spectrum and color filter subpixels are employed each of which transmit all light in one third of the spectrum corresponding to one primary hue and absorb all light received in the remainder of the visible spectrum (i.e., an ideal color filter array), it is apparent that two thirds of the light emitted is internally absorbed and emission efficiency is necessarily limited to only one third that possible with the color filter array absent. In other words, superimposing a multicolor image display capability on a white emitter by the use of a color filter array reduces emission efficiency by two thirds in an ideal system. In actual implementation emission of uniform intensity throughout the visible spectrum as well as ideal absorption and transmission by the filter elements cannot be achieved, and this further reduces system efficiency.

The present invention offers the advantage of requiring no pixel or sub-pixel patterning of the organic electroluminescent medium. Further, it is not necessary to obtain emission from the organic electroluminescent medium over the entire visible spectrum. In addition, no filter element is required that selectively transmits only a portion of light received.

Since device feature dimensions such as layer thicknesses are frequently in sub-micrometer ranges, the drawings are scaled for ease of visualization rather than dimensional accuracy.

DESCRIPTION OF PREFERRED EMBODIMENTS

The acronym EL is in some instances employed for the term "electroluminescent". The term "pixel" is employed in its art recognized usage to designate an area of an image display array that can be stimulated to luminesce independently of other areas. The term "multicolor" is employed to describe image display arrays that are capable of emitting light of a different hue in different areas (sub-pixels) of the same pixel. The term "full color" is employed to describe multicolor image display arrays that are capable of luminescing in the red, green and blue regions of the visible spectrum in different areas (sub-pixels) of a single pixel. The term "file" is employed to designate a row or column. The term "hue" refers to the intensity profile of light emission within the visible spectrum, with different hues exhibiting visually discernable differences in color.

Figure 1:
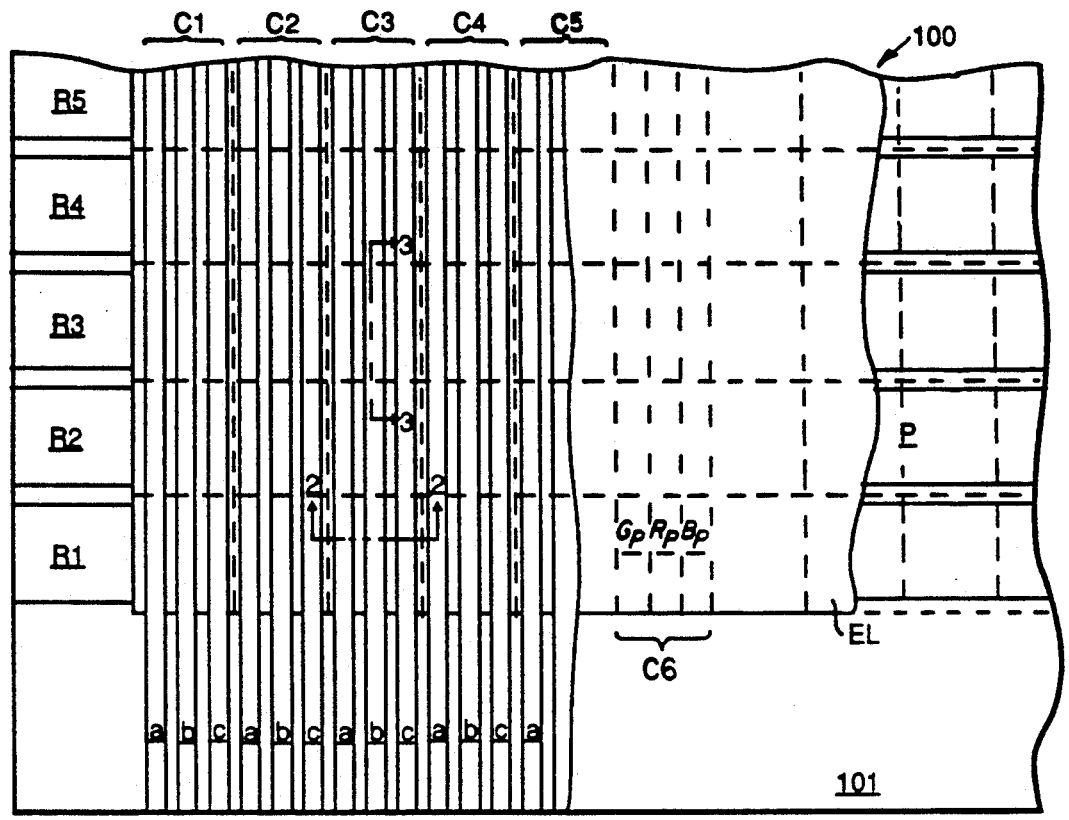
FIG. 1 is a plan view with portions broken away of a first embodiment of the invention.

Referring to FIG. 1, a portion of an organic EL device 100 is shown capable of producing a multicolor image. The upper surface of a light transmissive, preferably transparent, electrically insulative planarizing layer 101 is shown bearing a series of light transmissive, preferably transparent, first electrodes R1, R2, R3, R4 and R5. The first electrodes are laterally spaced on the support surface for electrical isolation in parallel rows. In contact with and overlying all but the left most extremities of the first electrodes is an organic EL medium EL. Overlying the organic EL medium is a series of second electrodes C1, C2, C3, C4 and C5 arranged in parallel columns that are laterally spaced one from the other. The second electrodes extend laterally beyond the lower (as shown in FIG. 1) edge of the organic EL medium onto the lower portion of the planarizing layer. In each column the electrode is divided into three parallel laterally spaced elements a, b and c. While in practice the device can (and in almost every instance will) have a much larger areal extent than shown, the portion of the device shown is sufficient to demonstrate its essential structure.

A grid of intersecting dashed lines are shown in FIG. 1 marking the boundaries of a series of pixels P. The pixels are arranged in an array of two intersecting sets of files. One set of files extends horizontally as shown in FIG. 1 and forms rows while the second set of files extends vertically as shown in FIG. 1 and forms columns. The lower row of pixels in FIG. 1 each overlie the first electrode R1, and each successive row of pixels overlies one of the successive first electrodes R2, R3, R4 and R5.

Proceeding from left to right in FIG. 1, a first column of the pixels share the common overlying second electrode C1 and successive columns of pixels similarly share successive second electrodes. A column of pixels C6 is shown in an area where overlying second electrodes have been broken away for ease of viewing. In column C6 the pixels are shown to be further divided into sub-pixels Gp, Rp and Bp. In fact, each column of pixels is similarly divided, although, for ease of viewing, this detail is not indicated in each pixel. The sub-pixels Gp in each column include the overlying a element of each second electrode, the sub-pixels Rp in each column include the overlying b element of each second electrode, and the sub-pixels BP in each column include the overlying c element of each second electrode. The sub-pixels Gp, Rp and Bp differ in that they emit green, red and blue light, respectively.

Figure 2:
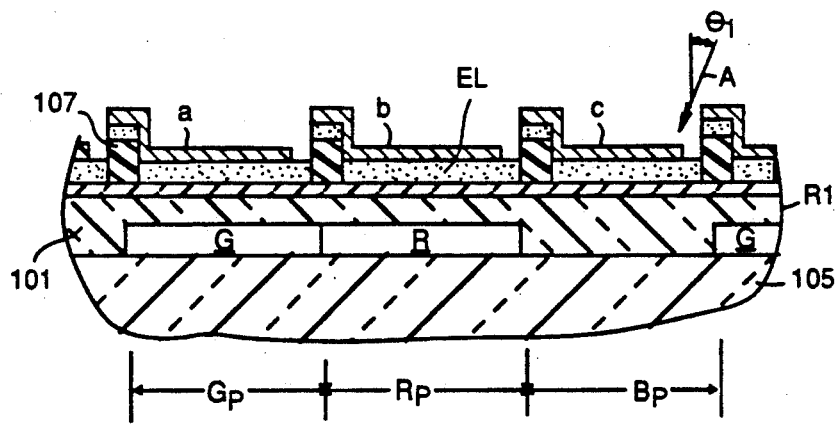
FIGS. 2 and 3 are sectional views taken along section lines 2—2 and 3—3, respectively, in FIG. 1.
Figure 3:
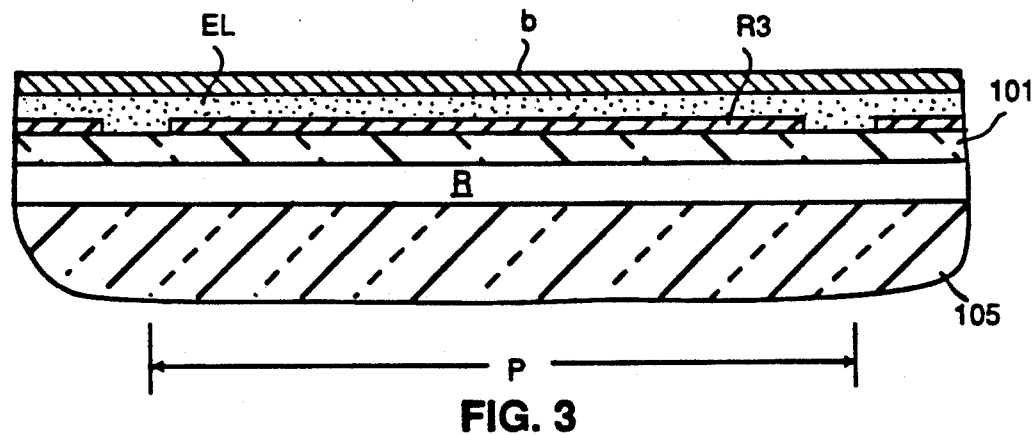

The structure of the device that creates the sub-pixels, the structure that divides the second electrodes into separate elements, and the manner in which this structure is fabricated can be appreciated by reference to FIGS. 2 and 3. The construction of the device 100 begins with a light transmissive, preferably transparent support 105. Polymer and, particularly, glass supports are generally preferred. On the upper surface of the support is formed a patterned fluorescent medium G that emits in the green and a patterned fluorescent medium R that emits in the red. Each of the fluorescent media G and R are patterned to lie in the areas of the Gp and RP sub-pixels, respectively. That is, the fluorescent media G and R are each confined to one sub-pixel column within each column of pixels P. Fortunately, both the fluorescent media and support can be selected from among a variety of materials that are capable of withstanding conventional patterning techniques, such as photolithography, without degradation of their properties.

Together the sub-pixel columns formed by the green and red fluorescent media account for approximately two thirds of the area of each column of pixels. To provide a smooth surface for deposition of the next layers of the device it is preferred, although not required, to fill in the columns corresponding to subpixels Bp separating adjacent columns of green and red fluorescent media. It is possible by conventional patterning techniques to place a convenient transparent material in these columns to the exclusion of all other areas on the support, but the more common approach and the preferred approach is simply to spin cast the planarizing layer 101 as shown over all the upper surfaces of the green and red fluorescent media and the support, since no patterning is required. This either entirely eliminates (as shown) or minimizes disparities in surface height encountered in subsequent coating steps. Any of a variety of light transmissive, preferably transparent electrically insulative conventional planarizing materials can be employed. Preferred planarizing materials are organic monomers or polymers that can be polymerized and/or crosslinked after deposition to create a rigid planar surface. A rigid planarizing layer can also be produced by sol-gel glass forming techniques.

Instead of spin casting a planarizing layer it is alternatively possible simply to place a planar rigid element that is light transmissive, preferably transparent and electrically insulative on the surface of the fluorescent media. Instead of depositing the fluorescent media on the upper surface of the support it is also alternatively possible to deposit the fluorescent media on the lower surface of the rigid element serving the function of the planarizing layer. The use of a spin cast planarizing layer rather than an interposed rigid element is preferred, since this allows the upper surfaces of the fluorescent media to be nearer the planar surface being created. When the planarizing material is confined by patterning to the areas of sub-pixels Bp, the upper surfaces of the fluorescent media actually form part of the planar surface being created.

The first electrodes are next formed over the surface of the planarizing layer. Any convenient conventional choice of deposition and patterning techniques can be employed. The planarizing layer protects the underlying fluorescent media and is itself capable of withstanding conventional patterning techniques, such as photolithographic patterning. The first electrodes are electrically conductive and light transmissive, preferably transparent. In a specifically preferred form the first electrodes are formed of indium tin oxide. A uniform layer of indium tin oxide can be formed into electrodes by conventional photolithographic patterning. For example, photoresist patterning followed by etching of the unprotected indium tin oxide areas with hydroiodic acid followed in turn by photoresist removal and rinsing provides the desired pattern of first electrodes. The planarizing layer and first electrodes possess a high degree of chemical stability, allowing photolithography to be conducted over their surfaces in subsequent fabrication steps without degradation.

In the preferred form of the invention a series of parallel walls 107 are next formed over the first electrodes and the surface of the planarizing layer adjacent the first electrodes, hereinafter collectively referred to as the deposition surface. The walls are located at the shared boundaries of adjacent sub-pixel columns. The walls can be formed by any convenient conventional patterning technique.

In a simple, specifically preferred technique the walls are formed by spin coating a negative working photoresist onto the deposition surface. A single spin coating can conveniently produce a photoresist layer thickness of up to 20 μm, well in excess of the minimum wall height required for the devices of this invention. Patterned exposure crosslinks the photoresist to an insoluble form in exposed areas while unexposed areas can be removed by development and washing techniques. Crosslinking by exposure produces strong, relatively rigid walls.

Numerous alternative wall forming techniques are possible. Instead of spin casting and using a photoresist developer, two "wet chemistry" steps, a photoresist layer can be formed on the support by laminating a photoresist coating on a flexible support, such as transparent film, to the supporting surface. In this form the photoresist is typically a monomer that is polymerized by imagewise exposure following lamination. After imagewise exposure stripping the film also removes the monomer in areas that are not exposed. No "wet chemistry" step is entailed.

In another wall forming technique the photoresist does not form the walls, but defines the wall pattern by its presence in areas surrounding the walls on the supporting surface. Photoresist layer formation can take any of the forms described above, but imagewise exposure is chosen to leave the photoresist in the areas surrounding the walls. Either a positive or negative working photoresist can be employed. Subsequently a wall forming material, such as silica, silicon nitride, alumina, etc., is deposited uniformly so that it overlies the photoresist where present and is deposited on the deposition surface in wall areas. After the walls are formed, the photoresist can be removed by any convenient conventional technique—e.g. solvent lift-off.

After the walls are formed along common boundaries of adjacent sub-pixel columns, the organic EL medium EL is next deposited by any convenient conventional vapor phase deposition technique over the walls and the remainder of the deposition surface. As shown in FIG. 1 the left and lower edges of the deposition surface are free of the organic EL medium so that the portions of the electrode elements extending into these areas are available for external electrical lead attachments. These laterally extended portions of the electrode elements are commonly referred to as bonding pads. A mask, such as a strip of tape, along the edges of the substrate adjacent bonding pad sites can be used to define the deposition pattern of the organic EL medium. Alternatively, the organic EL medium can be deposited over the entire deposition surface and then mechanically removed by abrasion.

Generally any vapor phase deposition technique can be employed known to be useful in depositing one or more layers of an organic EL medium. It is generally preferred that the height of the walls be chosen to exceed the thickness of the organic EL medium. In efficient device constructions the organic Et medium, even when present in multilayer forms, has a thickness of less than 1 μm (10,000 Å) and typically less than half this thickness. Hence achieving useful wall heights is well within the capabilities of conventional patterning techniques useful for wall formation.

Following deposition of the organic EL medium, a source is provided for the metals used for deposition of the second electrode elements. For efficient organic EL devices the second electrode elements require a metal having a lower (less than 4.0 eV) work function to be in contact with the organic EL medium. One or more low work function metals alone or combination with one or more higher work function metals are deposited on the organic EL medium by any convenient directional (i.e., line of sight) transport technique. To insure linear transport from their source to the organic EL medium surface the metal atoms are preferably transported through a reduced pressure atmosphere. This increases the mean free path of the metal ions during transport from the source to the surface of organic EL medium, thereby minimizing scattering and maintaining deposition in a directionally controlled manner. Generally the pressure of the ambient atmosphere during deposition is reduced so that the spacing between the source and the surface of the organic EL medium is less than the mean free travel path of the metal atoms (that is, less than the distance a metal atom on average travels before colliding an atom in the ambient atmosphere). Conventional deposition techniques compatible with the directional transport requirements include vacuum vapor deposition, electron beam deposition, ion beam deposition, laser ablation and sputtering.

To achieve a deposition pattern of the second electrode elements in laterally spaced columns the deposition surface is positioned in relation to the source of metal to be deposited so that each wall is interposed between the source and an adjacent portion of the surface of the organic EL medium. When deposition is undertaken in such an orientation the interposed portions of the walls intercept metal atoms travelling from the source, thereby preventing metal deposition on the organic EL medium on one side of each wall. This provides the spacing between adjacent rows of second electrode elements. Convenient preferred ranges of orientations in relation to the source of metal atoms are established when the direction of travel of the metal atoms (or the line of sight between the source) and the deposition surface indicated by arrow A forms an angle $\theta_1$ with the normal of the deposition surface (an axis normal to the deposition surface) of from about 100° to 600°, most preferably from about 150° to 450°.

Deposition of low (<4.0 eV) work function metal, alone or in combination of one or more higher work function metals, requires only that a continuous layer containing the low work function metal be deposited to achieve maximum efficiency of electron injection into the organic EL medium. However, to increase conductance (decrease resistance), it is preferred to increase the thickness of the second electrode elements beyond the 200 to 500 Å thickness levels contemplated to provide a continuous layer. Although thick electrodes of up to 1 μm or even higher can be formed using the original metal composition, it is generally preferred to switch deposition after initial formation of continuous layers containing low work function metal so that only relatively higher work function (and hence less chemically reactive) metals are deposited. For example, an initial continuous layer of magnesium (a preferred low work function metal) and silver, indium or aluminum would preferably be increased in thickness for the purpose of reducing second electrode element resistance by depositing a convenient higher work function metal commonly used in circuit fabrication, such as gold, silver, copper and/or aluminum. The combination of a lower work function metal at the interface of the organic EL medium and a higher work function metal completing the thickness of the overlying second electrode elements is particularly advantageous, since the higher electron injection efficiencies produced by a lower work function metal are fully realized even though the lower work function metal is limited to the second electrode element interface with the organic EL medium while the presence of the higher work metal increases the stability of the second electrode elements. Hence, a combination of high injection efficiency and high electrode element stability is realized by this arrangement.

In operation a selected pattern of light emission from the device 100 is produced that can be seen by viewing the bottom surface of the transparent support 105. In a preferred mode of operation the device is stimulated to emit by sequentially stimulating one row of pixels at a time and repeating the stimulating sequence at a rate chosen so that the interval between repeated stimulations of each row is less than the detection limit of the human eye, typically less than about 1/60th of a second. The viewer sees an image formed by emission from all stimulated rows, even though the device at any instant is emitting light from only one row.

To create the desired image pattern, the a, b and c elements of each of the second electrodes are independently electrically addressed while the first electrode R1 is electrically biased to support emission. If, for example, only green emission is wanted and that in only the columns including second electrodes C2, C3 and C4, the a elements in these columns are biased to support emission while the remaining second electrode elements are not electrically biased or given a bias of a polarity opposite that required to support emission. Immediately following emission in the desired pattern from the row of pixels joined by first electrode R1, a new pattern of stimulation is supplied to the second electrode elements, and the first electrode element R2 is next biased to stimulate the desired pattern of emission from the row of pixels it joins. Stimulation of patterned emission from successive rows is achieved by repeating the procedure described above while biasing successive first electrodes.

The organic EL medium EL is selected so that it emits in the blue region of the spectrum. In the blue emitting sub-pixels Bp light emitted by the organic EL medium penetrates the first electrodes, the planarizing layer (when present) and the support and is seen by the viewer as blue light.

In the green and red emitting pixels the same blue emitting organic EL medium is employed as in the blue emitting sub-pixels. The blue light emitted again penetrates the first electrodes and the planarizing layer (when present), but in the sub-pixels Gp and Rp the fluorescent media G and R, respectively, intercept and absorb the blue light emitted by the organic EL medium. The blue light stimulates fluorescent emission in the green or red.

A very significant advantage of absorbing blue light emission from the organic EL medium and reemitting longer wavelength, green or red, light by fluorescence is that the efficiency of light emission can be very much superior to that achieved employing a color filter array in combination with a white light emitting organic EL medium. In the latter arrangement a theoretical maximum efficiency of only 33 percent is possible, since each sub-pixel of the color filter array absorbs and does not transmit two-thirds of the photons it receives. Further, aside from efficiency losses due to the color filter array, it is to be noted that the organic EL medium cannot be optimized to emit in any one portion of the visible spectrum, but must emit throughout the visible spectrum. This places a further efficiency burden on this conventional arrangement and results in its overall efficiency as a practical matter being substantially less than 33 percent.

The efficiency of the present invention is controlled by (a) the efficiency of emission of blue light by the organic EL medium, (b) the efficiency with which the blue light is absorbed by the fluorescent media, and (c) the efficiency with which fluorescent media is stimulated to emit longer wavelength light. Considering (a) first, it is apparent that the blue emitting organic EL medium employed in the device 100 can be selected from a variety of highly efficient materials that would be highly inefficient in providing emission in each of the blue, green and red portions of the spectrum (i.e., in providing white light emission). Turning to (b), high levels of efficiency can be realized in absorbing blue light emitted by the organic EL medium. There is no reason in theory why 100% of the blue light emitted can not be absorbed by the fluorescent medium. It is contemplated that in all instances at least 50% and preferably at least 80% of blue light emitted in the green and red sub-pixels can be absorbed. Turning to (c), a variety of fluorescent materials are known that are capable of emitting at least 50% of the light they absorb and emission efficiencies in excess of 80% of light absorption are contemplated. Thus, within readily attainable levels of blue light absorption and longer wavelength fluorescence efficiencies, the green and red sub-pixels are capable of delivering to the viewer substantially greater than half the number of photons received from the blue emitting organic EL medium. For example, assuming an absorption efficiency of 80% and a fluorescence efficiency of 80%, both of which are readily attainable, 64% of the photons received from the organic EL medium are transmitted to the viewer in areas containing the fluorescent medium. In the blue sub-pixel areas, the efficiency is approximately 100%, since light absorption in the transparent electrode, planarizing layer (when present) and support can be negligible or nearly negligible.

Another significant advantage of the device 100 is that no patterning of the organic EL medium in pixel areas is required. This avoids the significant degradations in performance of conventional organic EL devices after patterning. For example, the construction of the device 100 requires no wet chemistry for patterning during or after deposition of the organic EL medium. No photolithographic patterning steps are required and no wet etching steps are required to be performed after the organic EL medium is deposited. This protects both the organic EL medium and the overlying second electrode elements from degradation.

The device 100 has the capability of full color imaging. Employing blue, green and red primary color emissions, the following emission combinations are possible from each pixel:
 (a) stimulate one sub-pixel to emit blue;
 (b) stimulate one sub-pixel to emit green;
 (c) stimulate one sub-pixel to emit red;
 (d) stimulate two sub-pixels to emit blue and green, creating the perception of cyan;
 (e) stimulate two sub-pixels to emit blue and red, creating the perception of magenta;
 (f) stimulate two sub-pixels to emit green and red, creating the perception of yellow;
 (g) stimulate all sub-pixels to create white light emission; and
 (h) stimulate none of the sub-pixels to provide a dark, essentially black background.

Although the multicolor image display device 100 fully satisfies the requirements of the invention, the device exhibits some disadvantages. First, referring to FIG. 1, it is apparent that in successively biasing each first electrode it must carry current to each of the pixels in the same row that is to emit light. Hence, the current carried by each first electrode is the sum of the currents carried by each of the second electrode elements in stimulating a row of pixels to emit light. The disadvantage of this arrangement is that the first electrodes must be light transmissive for light emissions to be seen and their thicknesses must be limited to retain this property. However, limiting first electrode thickness also limits conductance.

If the pixels are addressed in columns rather than rows, each of the second electrode elements a, b and c must carry the current of all pixels in the same column. Although the thickness of the second electrode elements can and usually does exceed that of the first electrodes, the width of the second electrode elements must be less than the width of a sub-pixel. As a consequence, the conductance of the second electrode elements is also restricted. Further, addressing the pixels column by column is unattractive, since in an array having an equal number of pixels in columns and rows the addressing rate for columns must be three times that employed for rows, since each column contains three second electrode elements. Since the time in which the sub-pixels in a column can be biased to emit light is reduced to one third that required for row by row addressing, the biasing voltage must be increased as compared to row addressing to maintain a sub-pixel coulomb level and emission level during biasing equal to that obtained with row by row addressing. Increased biasing voltages and tripled addressing rates for comparable emission properties represent a significant disadvantage.

Figure 4:
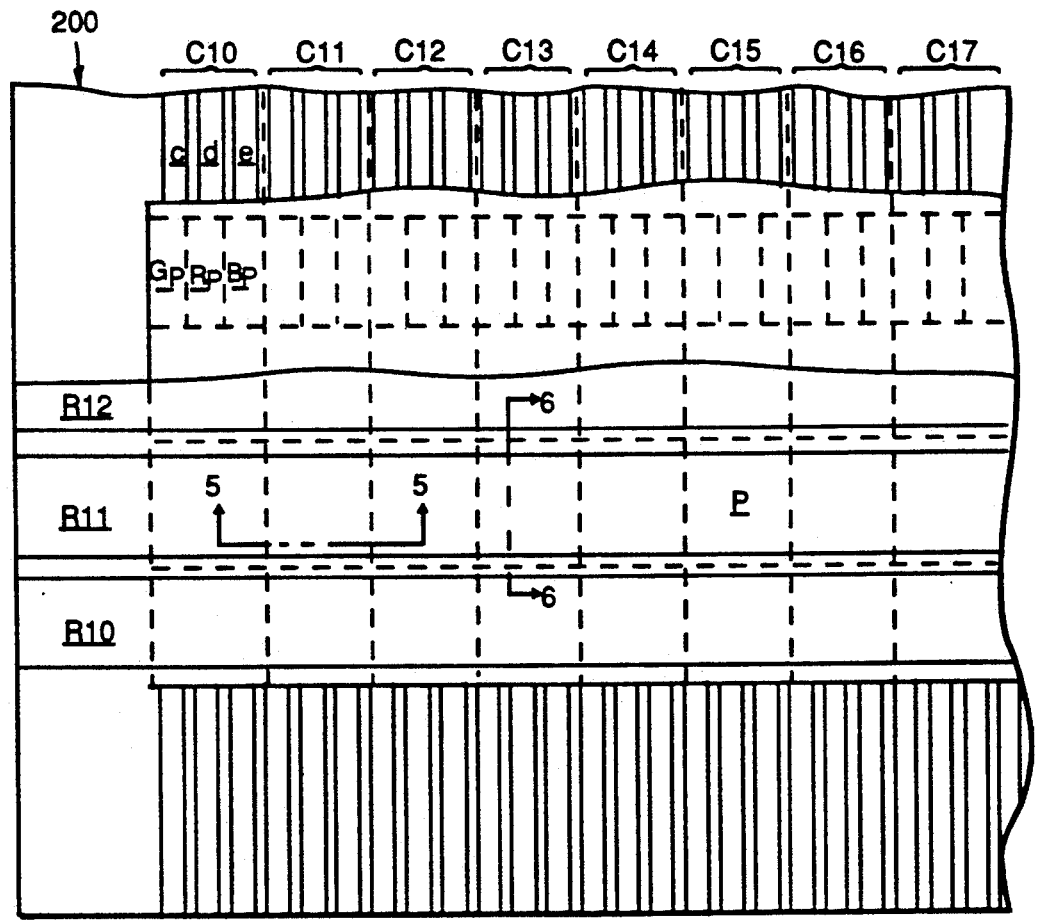
FIG. 4 is a plan view with portions broken away of a second embodiment of the invention.

The multicolor organic EL image display device 200 shown in FIG. 4 exhibits all of the imaging capabilities of the device 100 while at the same time overcoming its disadvantages noted above. Except as specifically noted, the features of the device 200 can take any of the forms described in connection with the device 100 and therefore require no further explanation.

The first electrodes C10, C11, C12, C13, C14, C15, C16 and C17 of device 200 are each divided into elements c, d and e. These first electrode elements have the light transmissive properties of the first electrodes of device 100 and, like the first electrodes of device 100, are formed prior to depositing the organic EL medium. Each first electrode element c forms a part of and joins sub-pixels Gp in the same column; each first electrode element d forms a part of and joins sub-pixels Rp in the same column; and each third electrode element e forms a part of and joins sub-pixels Bp in the same column. The second electrodes R10, R11 and R12 can be constructed of the same materials and in the same thickness ranges as the second electrode elements of device 100, but are arranged in rows rather than columns. The row arrangement allows the second electrodes to be wider than the second electrodes of device 100.

The electrode arrangement of the device 200 achieves higher electrode conductances than can be realized in device 100. In addressing a row of pixels each of the first electrode elements c, d and e is biased independently to achieve the desired pattern of emission from the pixels in one row. Simultaneously one of the second electrodes is biased to stimulate emission within a selected row. Each of the first electrode elements stimulates only one sub-pixel and carries only the current of one sub-pixel. The second electrode in the selected row carries the current of all the sub-pixels stimulated to emit in that row. Since the second electrodes need not be light transmissive and, hence, can be much thicker as well as wider than the first electrode elements, the conductance of the electrodes of device 200 can be higher than that of the electrodes of device 100.

Figure 5:
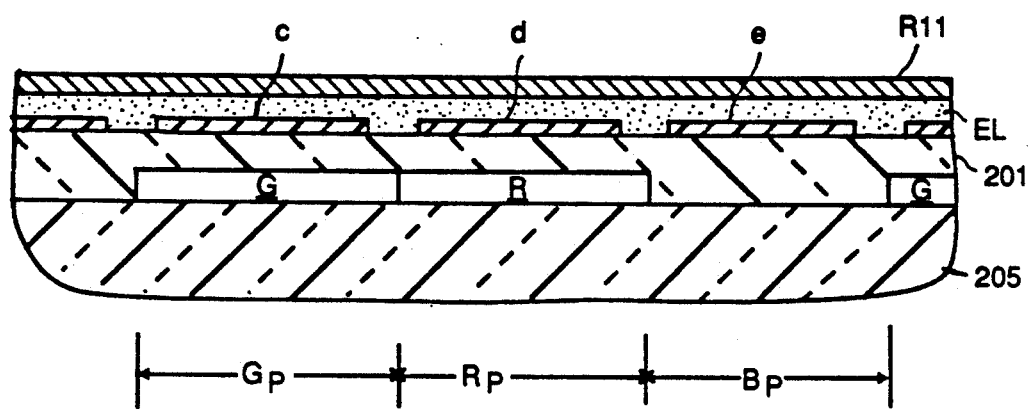
FIGS. 5 and 6 are sectional views taken along section lines 5—5 and 6—6, respectively, in FIG. 4.
Figure 6:
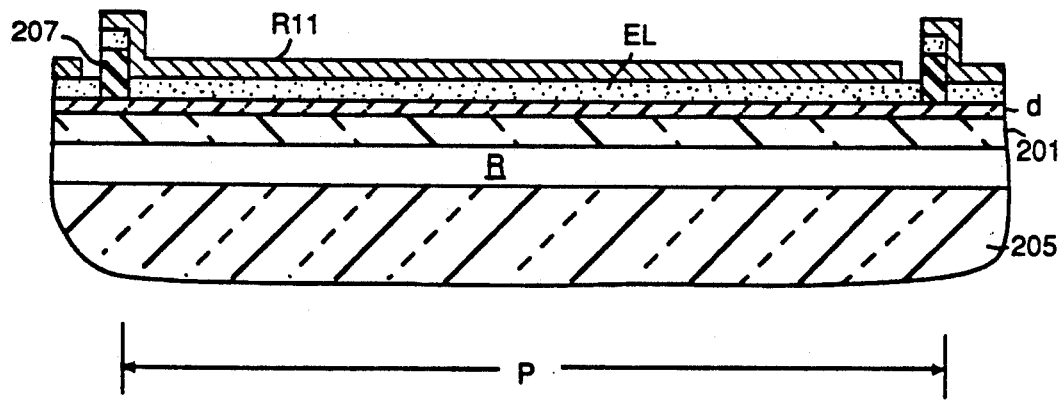

The construction of one of the pixels P of the device 200 is shown in FIGS. 5 and 6. The support 205, the patterned fluorescent media G and R, and the planarizing layer 201 are identical to corresponding elements in device 100. Except for the differences in patterning noted above, the first electrode elements c, d and e, the organic EL medium EL and the second electrodes are constructed similarly as described in connection with device 100.

In comparing FIGS. 2 and 6 it is apparent that the device 200 offers a significant structural advantage in the construction of the walls 207. These walls are located at the shared boundaries of adjacent rows of pixels. The device 200 contains fewer walls than device 100. Whereas in device 100 the number of walls is three times the number of pixel columns (plus one additional wall), in device 200 the number of walls is equal to the number of rows (plus one additional wall). For arrays containing an equal number of pixels in rows and columns there is approximately a 3 to 1 reduction in the number of walls that need be formed.

The materials of the image display organic EL devices of this invention can take any of the forms of conventional organic EL devices, such as those of Scozzafava, cited above; Tang U.S. Pat. No. 4,356,429; VanSlyke et al U.S. Pat. No. 4,539,507; VanSlyke et al U.S. Pat. No. 4,720,432; Tang et al U.S. Pat. No. 4,885,211; Tang et al U.S. Pat. No. 4,769,292; Perry et al U.S. Pat. No. 4,950,950; Littman et al U.S. Pat. No. 5,059,861 VanSlyke U.S. Pat. No. 5,047,687; Scozzafava et al U.S. Pat. No. 5,073,446; VanSlyke et al U.S. Pat. No. 5,059,862; VanSlyke et al U.S. Pat. No. 5,061,617; the disclosures of which are here incorporated by reference.

A specifically preferred support for the devices of the invention is a transparent glass support. The preferred first electrodes of the devices of this invention are transparent indium tin oxide electrodes coated directly on the glass support. Instead of employing indium tin oxide, tin oxide or a similar electrically conductive transparent oxide, the first electrode elements can be formed of thin, light transmissive layers of any of the high (e.g., greater than 4.0 eV) work function metals. Chromium and gold mixtures are particularly contemplated for forming the first electrodes. The first electrodes are typically in the range of from 1 μm (10,000 Å) to 500 Å in thickness, preferably in the range of from 3000 Å to 1000 Å in thickness.

Figure 7:
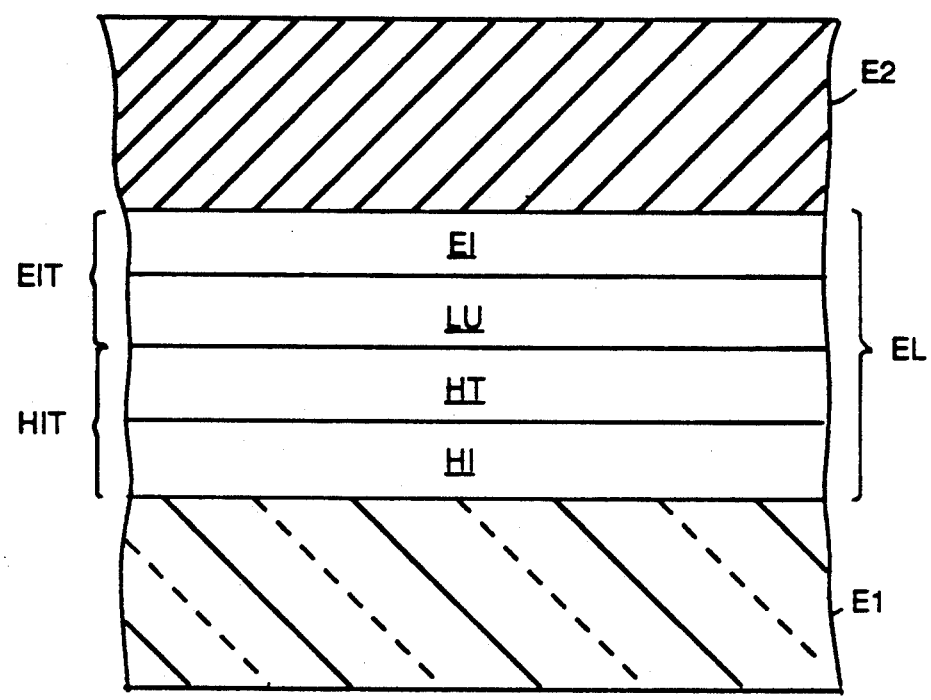
FIG. 7 is a sectional detail of the organic electroluminescent medium and the underlying and overlying electrodes.

As illustrated in FIG. 7, the organic EL medium EL coated over the first electrodes, represented by a first electrode E1, is preferably made up of a sequence of four superimposed layers. The layer in direct contact with each first electrode is a hole injecting layer HI that receives holes from the first electrode E1 when it is positively biased relative to a second electrode E2. In contact with and overlying the hole injecting layer is a hole transporting layer HT. The hole injecting layer and the hole transporting layer together form a hole injecting and transporting zone HIT. Overlying and in contact with the hole injecting and transporting zone is an electron injecting and transporting zone EIT formed by an electron injecting layer EI in contact with the second electrode and a luminescent layer LU. When the second electrode E2 is negatively biased in relation to the first electrode E1, electrons are received from the second electrode by the layer EI which in turn injects electrons into the luminescent layer LU. Concurrently holes are injected from the hole transporting layer HT into the luminescent layer. Hole-electron recombination in layer LU results in electroluminescence.

A functioning device requires only the luminescent layer LU between and in contact with the first and second electrodes. A marked increase in efficiency is realized when a two layer organic EL medium construction is employed consisting of the luminescent layer LU and the hole injecting layer HI. Each of the layers EI and HT independently contribute to achieving the highest levels of stability and efficiency. The the organic EL medium can be constructed of from one to four of the layers described, with only the luminescent layer Lu being essential to operability.

The hole injecting layer is preferably comprised of a porphyrinic compound of the type disclosed by Adler U.S. Pat. No. 3,935,031 or Tang U.S. Pat. No. 4,356,429, the disclosures of which are here incorporated by reference.

Preferred porphyrinic compounds are those of structural formula (I):

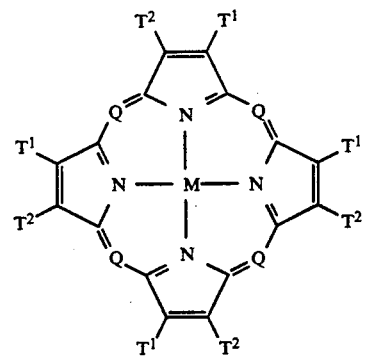

wherein
Q is —N= or —C(R)=;
M is a metal, metal oxide, or metal halide;
R is hydrogen, alkyl, aralkyl, aryl, or alkaryl, and
$T^1$ and $T^2$ represent hydrogen or together complete a unsaturated 6 membered ring, which can include substituents, such as alkyl or halogen. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogens for the metal atom, as indicated by formula (II):

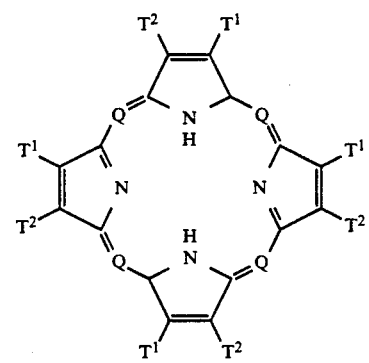

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
PC-1 Porphine
PC-2 1,10,15,20-Tetraphenyl-21H,23H-porphine copper (II)
PC-3 1,10,15,20-Tetraphenyl-21H,23H--porphine zinc (II)
PC-4 5,10,15,20-Tetrakis(pentafluorophenyl)21H,23H-porphine
PC-5 Silicon phthalocyanine oxide
PC-6 Aluminum phthalocyanine chloride
PC-7 Phthalocyanine (metal free)
PC-8 Dilithium phthalocyanine
PC-9 Copper tetramethylphthalocyanine PC-10 Copper phthalocyanine
PC-11 Chromium phthalocyanine fluoride
PC-12 Zinc phthalocyanine
PC-13 Lead phthalocyanine
PC-14 Titanium phthalocyanine oxide
PC-15 Magnesium phthalocyanine
PC-16 Copper octamethylphthalocyanine The hole transporting layer preferably contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

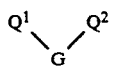

(III)

wherein
$Q^1$ and $Q^2$ are independently aromatic tertiary amine moieties and
G is a linking group such an arylene, cycloalkylene, or alkylene group or a carbon to carbon bond.

A particularly preferred class of triarylamines satisfying structural formula (III) and containing two triarylamine moieties are those satisfying structural formula (IV):

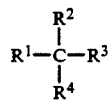

(IV)

where
$R^1$ and $R^2$ each independently represents a hydrogen atom, an aryl group or alkyl group or $R^1$ and $R^2$ together represent the atoms completing a cycloalkyl group and
$R^3$ and $R^4$ each independently represents an aryl group which is in turn substituted with a diaryl substituted amino group, as indicated by structural formula (V):

(V)

wherein $R^5$ and $R^6$ are independently selected aryl groups.

Another preferred class of aromatic tertiary amines are tetraaryldiamines. Preferred tetraaryldiamines include two diarylamino groups, such as indicated by formula (IV), linked through an arylene group. Preferred tetraaryldiamines include those represented by formula (VI).

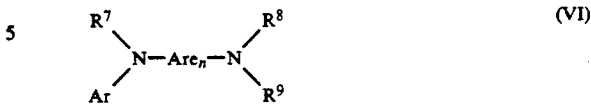

(VI)

wherein
Are is an arylene group,
n is an integer of from 1 to 4, and
Ar, R , R , and R are independently selected aryl groups.

The various alkyl, alkylene, aryl, and arylene moieties of the foregoing structural formulae (III), (IV), (V), and (VI) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Representative useful aromatic tertiary amines are disclosed by Berwick et al U.S. Pat. No. 4,175,960 and Van Slyke et al U.S. Pat. No. 4,539,507. Berwick et al in addition discloses as useful hole transporting compounds N substituted carbazoles, which can be viewed as ring bridged variants of the diaryl and triarylamines disclosed above.

Following the teachings of VanSlyke et al U.S. Pat. No. 5,061,569, cited above, it is possible to achieve higher organic EL device stabilities both during short term and extended operation by substituting for one or more of the aryl groups attached directly to a tertiary nitrogen atom in the aromatic tertiary amines described above an aromatic moiety containing at least two fused aromatic rings. The best combination of both short term (0–50 hours) and long term (0–300+ hours) of operation are achieved when the aromatic tertiary amines are those which (1) are comprised of at least two tertiary amine moieties and (2) include attached to a tertiary amine nitrogen atom an aromatic moiety containing at least two fused aromatic rings. The fused aromatic ring moieties of the tertiary amines can contain 24 or more carbon atoms and preferably contain from about 10 to 16 ring carbon atoms. While unsaturated 5 and 7 membered rings can be fused to six membered aromatic rings (i.e., benzene rings) to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moieties are naphthalene moieties, where the latter is understood to embrace all compounds containing a naphthalene ring structure. In monovalent form the naphthalene moieties are naphthyl moieties, and in their divalent form the naphthalene moieties are naphthylene moieties.

Illustrative of useful aromatic tertiary amines are the following:
ATA-1 1,1-Bis(4-di-p-tolylaminophenyl)cyclohexane
ATA-2 1,1-Bis(4-di-p-tolylaminophenyl)-4-phenyl cyclohexane ATA-3 4,4'''-Bis(diphenylamino)quaterphenyl
ATA-4 Bis(4-dimethylamino-2-methylphenyl)-phenylmethane
ATA-5 N,N,N-Tri(p-tolyl)amine
ATA-6 4-(di-p-tolylamino)-4'-[4(di-p-tolylamino)-styryl]stilbene
ATA-7 N,N,N',N'-Tetra-p-tolyl-4,4'-diaminobiphenyl
ATA-8 N,N,N',N'-Tetraphenyl-4,4'-diaminobiphenyl
ATA-9 N-Phenylcarbazole
ATA-10 Poly(N-vinylcarbazole)
ATA-11 4,4'-Bis[N-(1-naphthyl)-N-phenylamino]biphenyl
ATA-12 4,4''-Bis[N-(1-naphthyl)-N-phenylamino]-p-terphenyl
ATA-13 4,4'-Bis[N-(2-naphthyl)-N-phenylamino]biphenyl
ATA-14 4,4'-Bis[N-(3-acenaphthenyl)-N-phenylamino]biphenyl
ATA-15 1,5-Bis[N-(1-naphthyl)-N-phenylamino]naphthalene
ATA-16 4,4'-Bis[N-(9-anthryl)-N-phenylamino]biphenyl
ATA-17 4,4''-Bis[N-(1-anthryl)-N-phenylamino]-p-terphenyl
ATA-18 4,4'-Bis[N-(2-phenanthryl)-N-phenylamino]biphenyl
ATA-19 4,4'-Bis[N-(8-fluoranthenyl)-N-phenylamino]biphenyl
ATA-20 4,4'-Bis[N-(2-pyrenyl)-N-phenylamino]biphenyl
ATA-21 4,4'-Bis[N-(2-naphthacenyl)-N-phenylamino]biphenyl
ATA-22 4,4'-Bis[N-(2-perylenyl)-N-phenylamino]biphenyl
ATA-23 4,4'-Bis[N-(1-coronenyl)-N-phenylamino]biphenyl
ATA-24 2,6-Bis(di-12-tolylamino)naphthalene
ATA-25 2,6-Bis[di-(1-naphthyl)amino]naphthalene
ATA-26 2,6-Bis[N-(1-naphthyl)-N-(2-naphthyl)amino]naphthalene
ATA-27 4,4''-Bis[N,N-di(2-naphthyl)amino]terphenyl
ATA-28 4,4'-Bis{N-phenyl-N-[4-(1-naphthyl)phenyl]amino}biphenyl
ATA-29 4,4'-Bis[N-phenyl-N-(2-pyrenyl)amino]biphenyl
ATA-30 2,6-Bis[N,N-di(2-naphthyl)amine]fluorene
ATA-31 4,4''-Bis(N,N-di-p-tolylamino)terphenyl
ATA-32 Bis (N-1-naphthyl) (N-2-naphthyl)amine Any conventional blue emitting organic electroluminescent layer can be employed to form the layer LU. The term "blue emitting" is herein employed to indicate that visible emission occurs principally in the blue portion of the spectrum—that is, in the spectral region of from 400 to 500 nm. However, if the wavelength of peak emission is too near the green, a significant green emission can accompany the blue emission. It is therefore preferred to select blue emitting materials that exhibit a peak emission wavelength of less than 480 rim. Note that a peak emission in the near ultraviolet is not detrimental to the obtaining a blue hue of emission. Thus, so long as the electroluminescent layer is blue emitting it is immaterial whether peak emission occurs at wavelengths longer than or shorter than 400 nm.

It is preferred to employ mixed ligand aluminum chelates of the type disclosed by VanSlyke et al U.S. Pat. No. 5,150,006. In a specifically preferred form the mixed ligand aluminum chelates therein disclosed include bis($R^s$-8-quinolinolato)-(phenolato)aluminum(III) chelate, where $R^s$ is a ring substituent of the 8-quinolinolato ring nucleus chosen to block the attachment of more than two 8-quinolino-lato ligands to the aluminum atom. These compounds can be represented by the formula:

$$(R^s{-}Q)_2{-}Al{-}O{-}L \qquad (VII)$$

where

Q in each occurrence represents a substituted 8-quinolinolato ligand, $R^s$ represents an 8-quinolinolato ring substituent chosen to block sterically the attachment of more than two substituted 8-quinolinolato ligands to the aluminum atom, O-L is phenolato ligand, and L is a hydrocarbon of from 6 to 24 carbon atoms comprised of a phenyl moiety.

The advantage of employing an aluminum chelate with two substituted 8-quinolinolato ligands and a phenolato ligand is that all of the desirable physical properties of tris(8-quinolinolato)aluminum(III) chelates, the preferred green emitting luminophors of organic EL devices, are retained while emission is shifted to the blue region of the spectrum.

The presence of the phenolato ligand is responsible for shifting emissions to the blue portion of the spectrum. As employed herein the term "phenolato ligand" is employed in its art recognized usage to mean a ligand bonded to the aluminum atom by the deprotonated hydroxyl group of a phenol.

In its simplest form the phenolato ligand can be provided by deprononation of hydroxybenzene. Organic EL device performance has demonstrated that peak emission at a shorter wavelength than 500 nm and acceptable device stability (retention of at least a half of initial luminescent intensity for more than 50 hours) can be realized.

In an effort to improve performance, substituted phenols were next investigated. It was observed that methoxy and dimethoxy substituted phenolato ligands exhibited relatively weak luminescent intensities. Since methoxy substituents are electron donating, phenols were also investigated with strongly electron withdrawing substituents, such as halo, cyano and α-haloalkyl substituents. Aluminum chelates with these ligands, though luminophors, did not undergo successful vapor phase conversions.

It has been determined that the preferred phenolato ligands for the aluminum chelates of formula VII are derived from HO-L phenols, where L is a hydrocarbon of from 6 to 24 carbon atoms comprised of a phenyl moiety. This includes not only hydroxybenzene, but a variety of hydrocarbon substituted hydroxybenzenes, hydroxynaphthalenes and other fused ring hydrocarbons. Since monomethyl substitution of the phenyl moiety shorten emission wavelengths, it is preferred that the phenolato ligand contain at least 7 carbon atoms. Generally there is little advantage to be gained by employing phenolato ligands with very large numbers of carbon atoms. However, investigations of phenolato ligands with 18 aromatic ring carbon atoms have revealed high levels of stability. Thus, the phenolato ligands preferably contain from 7 to 18 total carbon atoms.

Aliphatic substituents of the phenyl moiety of phenolato ligand are contemplated to contain from 1 to 12 carbon atoms each. Alkyl phenyl moiety substituents of from 1 to 3 carbon atoms are specifically preferred, with the best overall characteristics having been observed to be produced with methyl substituents.

Aromatic hydrocarbon substituents of the phenyl moiety are preferably phenyl or naphthyl rings. Phenyl, diphenyl and triphenyl substitution of the phenyl moiety have all been observed to produce highly desirable organic EL device characteristics.

Phenolato ligands derived from α or β naphthols have been observed to produce aluminum chelates of exceptional levels of stability. A limited degree of emission shifting to shorter wavelengths is also realized, similar to that exhibited by hydroxybenzene derived phenolato ligands. By employing naphtholato ligand containing aluminum chelates in combination with blue emitting fluorescent dyes, described below, highly desirable device constructions are possible.

From comparisons of ortho, meta and para substituted homologues of the various phenolato ligands it has been determined that little, if any, difference in performance is attributable to the position on the phenyl moiety ring occupied by the hydrocarbon substituent.

In a preferred form the aluminum chelates satisfy the following formula:

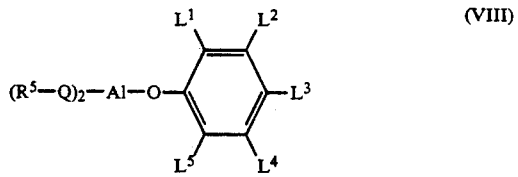

(VIII)

where

Q and $R^s$ are as defined above and $L^1$, $L^2$, $L^3$, $L^4$ and $L^5$ collectively contain 12 or fewer carbon atoms and each independently represent hydrogen or hydrocarbon groups of from 1 to 12 carbon atoms, with the proviso that $L^1$ and $L^2$ together or $L^2$ and $L^3$ together can form a fused benzo ring.

Although either or both of the 8-quinolinolato rings can contain substituents other than the steric blocking substituent, further substitution of the rings is not required. It is appreciated further that more than one substituent per ring can contribute to steric blocking. The various steric blocking substituent possibilities are most easily visualized by reference to the following formula:

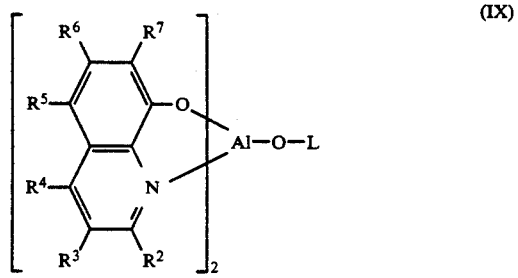

(IX)

where L can take any form described above and $R^2$ to $R^7$ represent substitutional possibilities at each of ring positions 2 to 7 inclusive of the 8-quinolinolato rings. Substituents at the 4, 5 and 6 ring positions are not favorably located to hinder sterically the bonding of three 8-quinolinolato nuclei to a single aluminum atom. While it is contemplated that large substituents at the 3 or 7 ring positions could provide sufficient steric hindrance, the incorporation of bulky substituents substantially increases molecular weight without enhancing molecular performance and therefore detracts from overall performance. On the other hand, the 2 ring position is suited to provide steric hindrance, and even a very small substituent (e.g., a methyl group) in one of these ring positions provides an effective steric blocking substituent. For synthetic convenience it is specifically preferred that steric blocking substituents be located in the 2 ring positions. As employed herein the term steric blocking is employed to indicate that the $R^s$-Q ligand is incapable of competing for inclusion as the third ligand of the aluminum atom.

Although the phenolato ligand is primarily relied upon to obtain blue emission, it has been observed that substituents to the 8-quinolinolato rings can also perform useful hue shifting functions. The quinoline ring consists of fused benzo and pyrido rings. When the pyrido ring component of the quinoline ring is substituted with one or more electron donating substituents the effect is to shift the hue of emission away from the green region of the spectrum and toward a more primary blue emission. Electron donating substituents at the ortho and para positions of the pyrido ring (that is, the 2 and 4 positions of the quinoline ring) particularly influence the hue of emission, while the meta position on the pyrido ring (the 3 position on the quinoline ring) has a comparatively small influence on the hue of emission. It is, in fact, recognized that an electron accepting substituent could, if desired, be located at the 3 ring position while retaining a blue emission characteristic. Although steric hindrance is entirely independent of electron donating or accepting properties and, thus, $R^2$ can in theory take the form of either an electron donating or accepting group, it is preferred to choose $R^2$ from among electron donating groups. By adding a second electron donating group $R^4$ a further shift in hue away from the green portion of the spectrum is achieved. $R^3$, when present, can take any synthetically convenient form, but is preferably also electron donating.

It is well within the skill of the art to determine whether a particular substituent is electron donating or electron accepting. The electron donating or accepting properties of several hundred of the most common substituents, reflecting all common classes of substituents have been determined, quantified and published. The most common quantification of electron donating and accepting properties is in terms of Hammett σ values. Substituents with negative Hammett σ values are electron donating while those with positive Hammett σ values are electron accepting. Hydrogen has a Hammett σ value of zero, while other substituents have Hammett σ values that increase positively or negatively in direct relation to their electron accepting or donating characteristics. Lange's Handbook of Chemistry, 12th Ed., McGraw Hill, 1979, Table 3-12, pp. 3-134 to 3-138, here incorporated by reference, lists Hammett σ values for a large number of commonly encountered substituents. Hammett σ values are assigned based on phenyl ring substitution, but they provide a workable guide for qualitatively selecting electron donating and accepting substituents for the quinoline ring.

Taking all factors together, steric blocking, synthetic convenience, and electron donating or accepting properties, $R^2$ is preferably an amino, oxy or hydrocarbon substituent. Adequate steric hindrance is provided when $R^2$ is methyl and is the sole 8-quinolinolato ring substituent (i.e., each of $R^3$, $R^4$, $R^5$, $R^6$ and $R^7$ is hydrogen). Thus, any amino, oxy or hydrocarbon substituent having at least 1 carbon atom falls within the preview of preferred substituents. Preferably no more than 10 carbon atoms are present in any one hydrocarbon moiety and optimally no more than 6 carbon atoms. Thus, $R^2$ preferably takes the form of —R', —OR' or —N(R")R', where R' is a hydrocarbon of from 1 to 10 carbon atoms and R" is R' or hydrogen. Preferably $R^2$ contains 10 or fewer carbon atoms and optimally 6 or fewer carbon atoms.

$R^3$ and $R^4$ for the reasons set forth above can take a broader range of forms than $R^2$, but are specifically contemplated to be selected from among the same group of preferred substituents as $R^2$. Since 3 and 4 ring position substitution is not required, $R^3$ and $R^4$ can additionally be hydrogen.

Since 5, 6 or 7 ring position substitution is not required, $R^5$, $R^6$ and $R^7$ can represent hydrogen. In preferred forms $R^5$, $R^6$ and $R^7$ can be selected from synthetically convenient electron accepting substituents, such as cyano, halogen, and a-haloalkyl, (x-haloalkoxy, amido, sulfonyl, carbonyl, carbonyloxy and oxycarbonyl substituents containing up to 10 carbon atoms, most preferably 6 or fewer carbon atoms.

The following constitute specific examples of preferred mixed ligand aluminum chelates satisfying the requirements of the invention:

PC-1 Bis(2-methyl-8-quinolinolato)(phenolato)-aluminum(III)

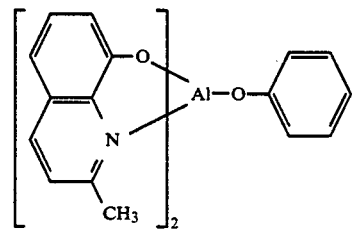

PC-2 Bis(2-methyl-8-quinolinolato)(ortho-cresolato)aluminum(III)

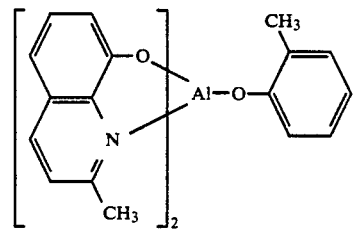

PC-3 Bis(2-methyl-8-quinolinolato)(meta-cresolato)aluminum(III)

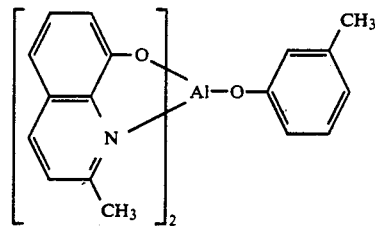

PC-4 Bis(2-methyl-8-quinolinolato)(para-cresolato)aluminum(III)

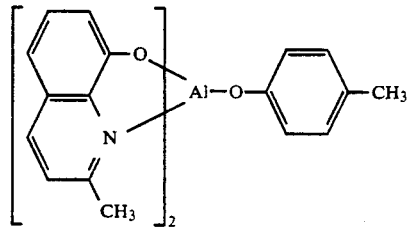

PC-5 Bis(2-methyl-8-quinolinolato)(ortho-phenylphenolato)aluminum(III)

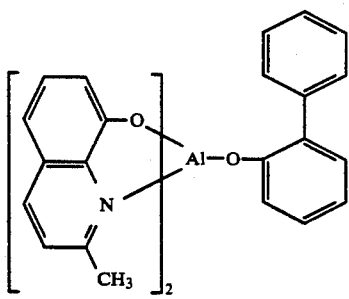
PC-6 Bis(2-methyl-8-quinolinolato)(meta-phenylphenolato)aluminum(III)
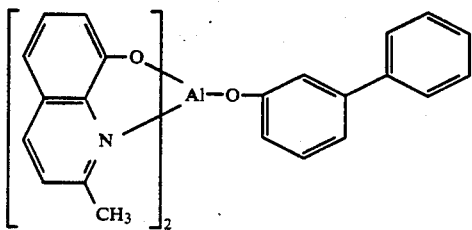
PC-7 Bis(2-methyl-8-quinolinolato)(para-phenylphenolato)aluminum(III)
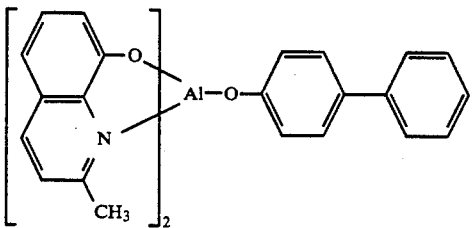
PC-8 Bis(2-methyl-8-quinolinolato)(2,3-dimethylphenolato)aluminum(III)
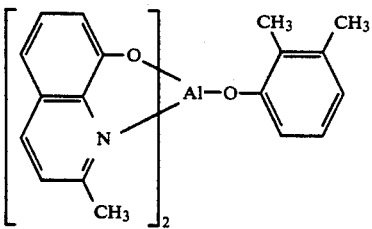
PC-9 Bis(2-methyl-8-quinolinolato)(2,6-dimethylphenolato)aluminum(III)
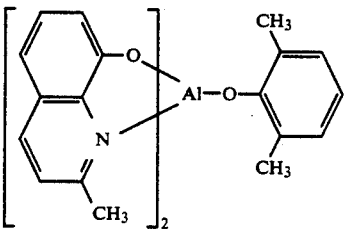
PC-10 Bis(2-methyl-8-quinolinolato)(3,4-dimethylphenolato)aluminum(III)

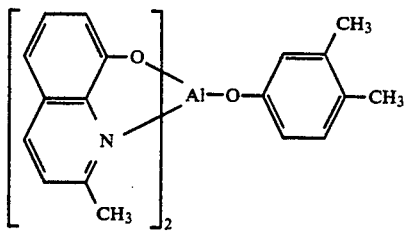
PC-11 Bis(2-methyl-8-
quinolinolato)(3,5-dimethylphenolato)aluminum(III)
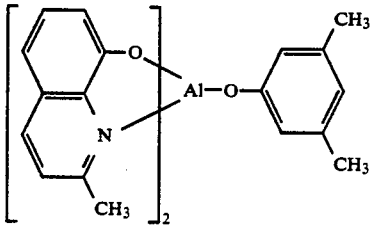
PC-12 Bis(2-methyl-8-quinolinolato)(3,
5-di-tert-butylphenolato)aluminum(III)
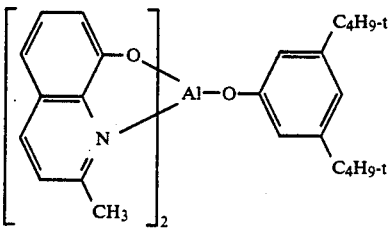
PC-13 Bis(2-methyl-8-
quinolinolato)(2,6-diphenylphenolato)aluminum(III)
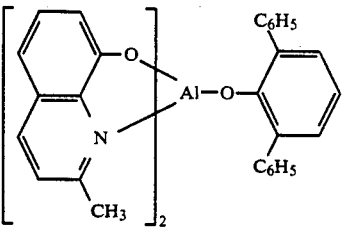
PC-14 Bis(2-methyl-8-
quinolinolato)(2,4,6-triphenylphenolato)aluminum(III)
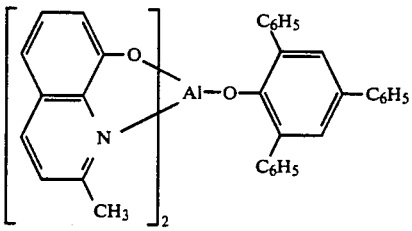
PC-15 Bis(2-methyl-8-quinolinolato)(2,
3,6-trimethylphenolato)aluminum(III)
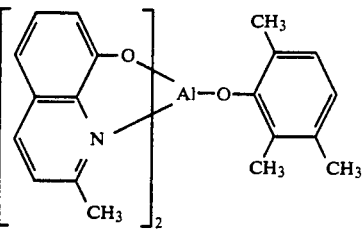

PC-16 Bis(2-methyl-8-quinolinolato)(2,3,5,6-tetramethylphenolato)aluminum(III)

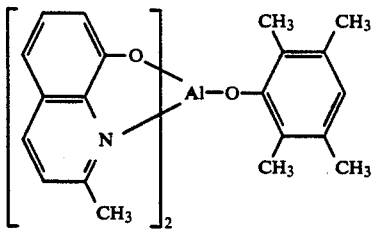

PC-17 Bis(2-methyl-8-quinolinolato)(1-naphtholato)aluminum(III)

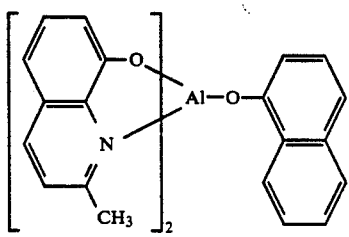

PC-18 Bis(2-methyl-8-quinolinolato)(2-naphtholato)aluminum(III)

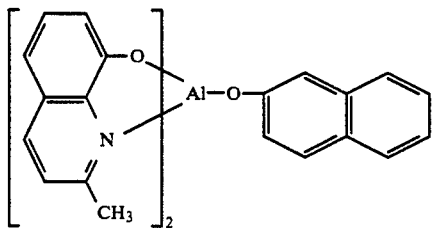

PC-19 Bis(2,4-dimethyl-8-quinolinolato)(orthophenylphenolato)aluminum(III)

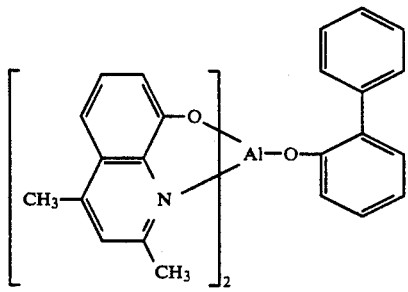

PC-20 Bis(2,4-dimethyl-8-quinolinolato)(paraphenylphenolato)aluminum(III)

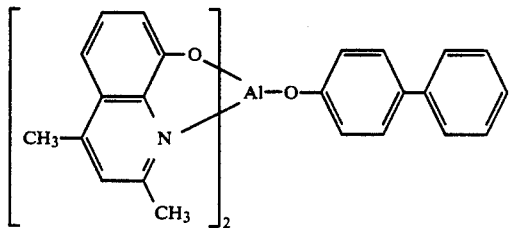

PC-21 Bis(2,4-dimethyl-8-quinolinolato)(metaphenylphenolato)aluminum(III)

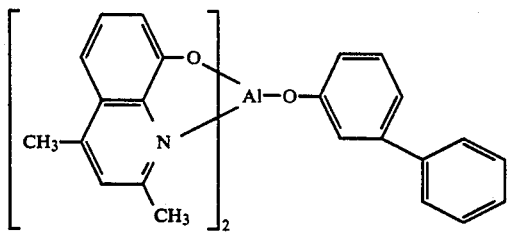
PC-22 Bis(2,4-dimethyl-8-quinolinolato)(3,5-dimethylphenolato)aluminum(III)
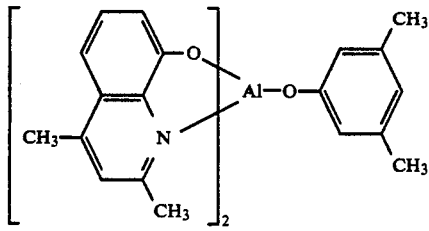
PC-23 Bis(2,4-dimethyl-8-quinolinolato)(3,5-di-tert-butylphenolato)aluminum(III)
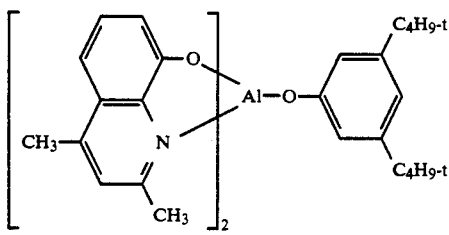
PC-24 Bis(2-methyl-4-ethyl-8-quinolinolato)(paracresolato)aluminum(III)
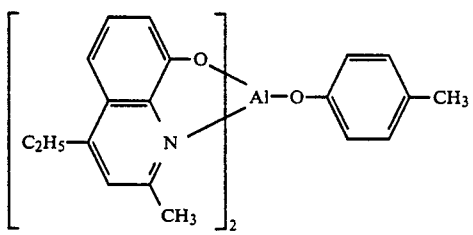
PC-25 Bis(2-methyl-4-methoxy-8-quinolinolato)(paraphenylphenolato)aluminum(III)
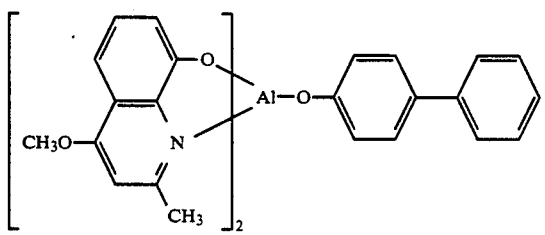
PC-26 Bis(2-methyl-5-cyano-8-quinolinolato)(orthocresolato)aluminum(III)
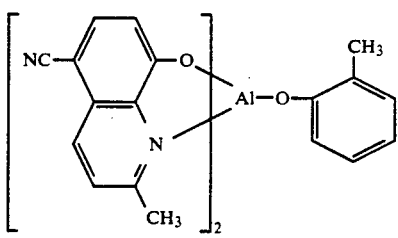

PC-27 Bis(2-methyl-6-trifluoromethyl-8-quinolinolato)(2-naphtholato)aluminum(III)

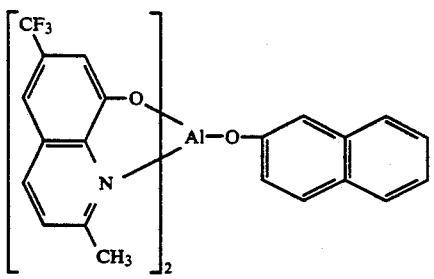

Instead of employing a bis($R^5$-8-quinolinolato)(phenolato)aluminum(III)chelate for blue emission as described above it is alternatively contemplated to employ for the blue emitting luminescent layer a blue emitting bis($R^5$-8-quinolinolato)aluminum(III)-μ-oxobis($R^2$-8-quinolinolato)aluminum(III) compound. The use of these compounds in organic EL devices is taught by VanSlyke U.S. Ser. No. 738,776, filed Jan. 8, 1991, commonly assigned, titled IMPROVED BLUE EMITTING INTERNAL JUNCTION ORGANIC ELECTROLUMINESCENT DEVICE (I). These compounds broadly satisfy the formula:

($R^5$—Q)$_2$—Al—O—Al—(Q—$R^5$)$_2$   (x)

and in a specific preferred form satisfy the formula:

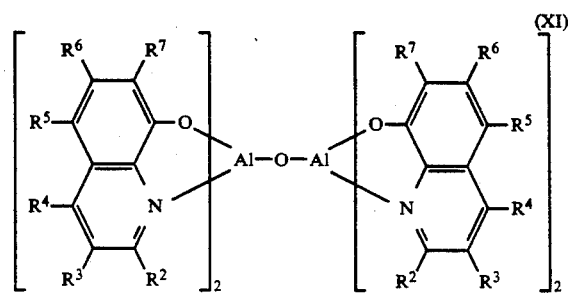

where Q, $R^5$ and $R^2$ to $R^7$ are as previously described in connection with formulae VII and VIII.

The following constitute specific examples of preferred compounds satisfying formulae X and XI:

BA-1 Bis(2-methyl-8-quinolinolato)aluminum(III)-μ-oxo-bis(2-methyl-8-quinolinolato)aluminum(III)

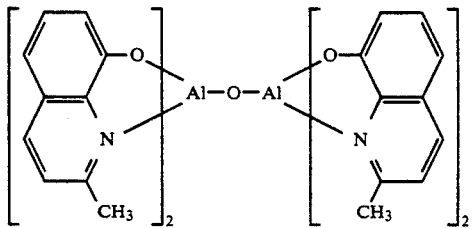

BA-2 Bis(2,4-dimethyl-8-quinolinolato)aluminum(III)-μ-oxo-bis(2,4-dimethyl-8-quinolinolato)-aluminum(III)

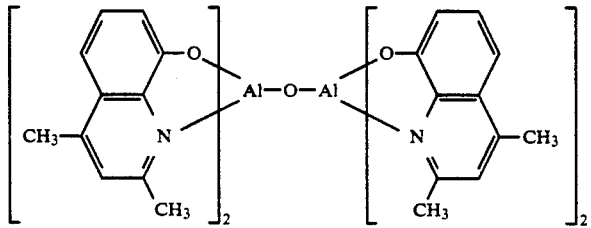

BA-3 Bis(4-ethyl-2-methyl-8-quinolinolato)aluminum(III)-μ-oxo-bis(4-ethyl-2-methyl-8-quinolinolato)-aluminum(III)

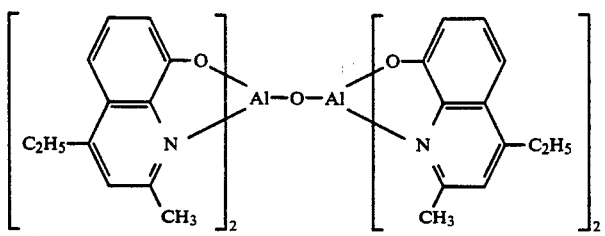

BA-4 Bis(2-methyl-4-methoxyquinolato)aluminum(III)-μ-oxo-bis(2-methyl-4-methoxyquinolinolato)-aluminum(III)

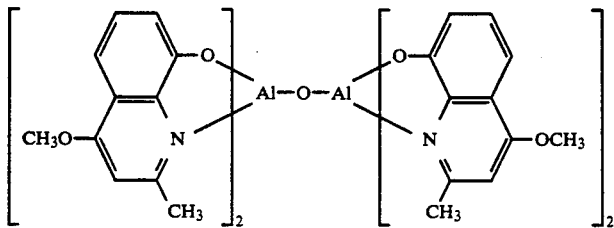

BA-5 Bis(5-cyano-2-methyl-8-quinolinolato)aluminum(III)-μ-oxo-bis(5-cyano-2-methyl-8-quinolinolato)aluminum(III)

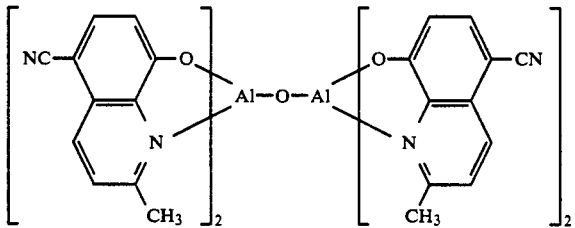

BA-6 Bis(2-methyl-5-trifluoromethyl-8-quinolinolato)aluminum(III)-μ-oxo-bis(2-methyl-5-trifluoromethylquinolinolato)aluminum(III)

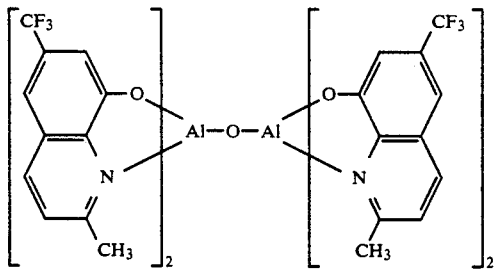

The luminescent layer in one set of subpixels can consist of any one or combination of the blue emitting compounds of formulae VIII to XII. Instead of employing the blue emitting compounds alone in the luminescent layer they can be employed as a host for a blue emitting fluorescent dye following the teachings of Tang et al U.S. Pat. No. 4,769,292, cited above, the disclosure of which is here incorporated by reference. Any blue emitting combination of one or more fluorescent dyes and one or more compounds satisfying any of formulae VIII to XII can be employed.

In one preferred form of the invention a blue emitting portion of the organic EL medium contains a formulae VIII to XII compound as a host and at least one blue emitting fluorescent dye containing a perylene or benzopyrene chromophoric unit. These chromophoric units require at least 5 fused carbocyclic aromatic rings and 20 carbon atoms in the aromatic rings. Additional fused rings do not detract from blue emission can be contained in the chromophoric unit. It is generally preferred to employ chromophoric units that contain from 20 to 40 ring carbon atoms.

The following is a listing of illustrative compounds contemplated for use as blue fluorescent dyes containing a perylene or benzopyrene chromophoric unit:

FD-1 Perylene

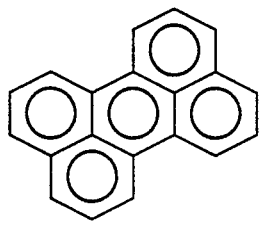

-continued

FD-2 Benzo[b]perylene

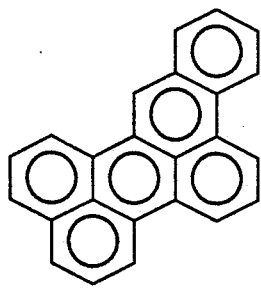

FD-3 Dibenzo[fg,ij]pentaphene

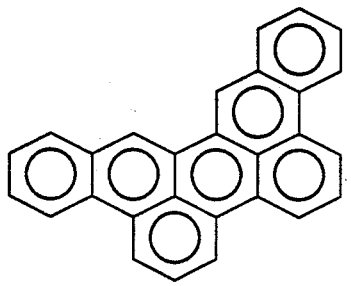

FD-4 Benzo[a]pyrene

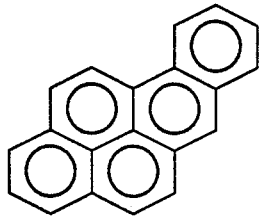

FD-5 Dibenzo[a,e]pyrene

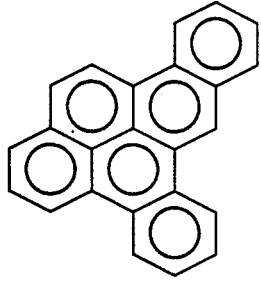

FD-6 Dibenzo[b,h]pyrene

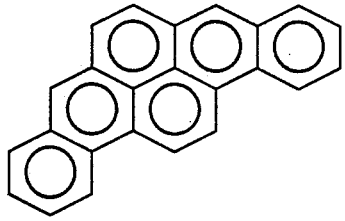

FD-7 Dibenzo[e,l]pyrene

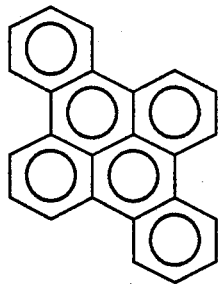

FD-8 Dibenzo[a,h]pyrene

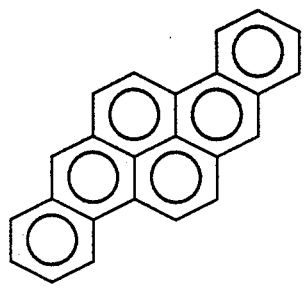

FD-9 Dibenzo[de,qr]naphthacene

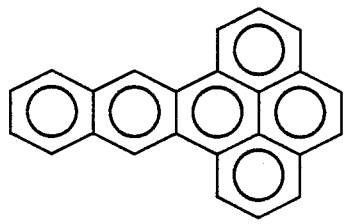

FD-10 Dibenzo[c,Mn]chrysene

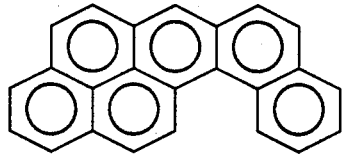

FD-11 Dibenzo[opq,stu]picene

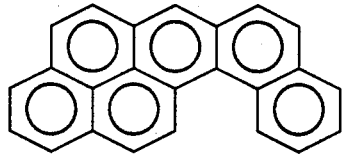

These aromatic ring compounds have the advantage that they can be deposited by vacuum vapor deposition, similarly as the other components of the organic medium. Since the aromatic compounds noted above represent chromophores in and of themselves, it is not necessary that other ring substituents be present. However, many dyes containing aromatic rings as chromophores are conventional, having been originally prepared for use in solution chemistry and therefore having substituents intended to modify solubility and, in some instances, hue. Various aromatic ring substituents of the types disclosed by Tang et al U.S. Pat. No. 4,762,292, cited above, are contemplated.

When one of the blue emitting aluminum chelates noted above is employed in forming a blue emitting luminescent layer, higher levels of efficiency are realized when the electron injecting layer employs a metal oxinoid charge accepting compound satisfying the formula:

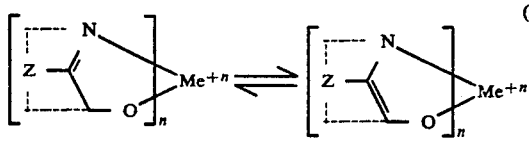

where
Me represents a metal,
n is an integer of from 1 to 3, and
Z represents the atoms necessary to complete an oxine nucleus.

Illustrative of useful chelated oxinoid compounds are the following:
CO-1 Aluminum trisoxine
CO-2 Magnesium bisoxine
CO-3 Bis[benzo{f}-8-quinolinolato] zinc
Co-4 Aluminum tris(5-methyloxine)
Co-5 Indium trisoxine
Co-6 Lithium oxine
CO-7 Gallium tris(5-chlorooxine)
CO-8 Calcium bis(5-chlorooxine)
CO-9 Poly[zinc (II)-bis(8-hydroxy-5-quinolinyl)methane]
CO-10 Dilithium epindolidione
CO-11 Aluminum tris(4-methyloxine)
CO-12 Aluminum tris(6-trifluoromethyloxine)

Of the various metal oxinoids, the most highly preferred are the tris-chelates of aluminum. These chelates are formed by reacting three 8-hydroxyquinoline moieties with a single aluminum atom. Specifically preferred are aluminum trisoxine [a.k.a., tris(8-quinolinol) aluminum] and aluminum tris(5-methyloxine) [a.k.a. tris(5-methyl-8-quinolinol) aluminum].

As previously noted, the overall thickness of the organic EL medium is in all instances less than 1 μm (10,000 Å) and, more typically, less than 5000 Å. The individual layers of the organic EL medium can exhibit thicknesses as low as 50 Å while achieving satisfactory performance. It is generally preferred that individual layes of the organic EL medium have a thickness in the range of from 100 to 2000 Å and that the overall thickness of the organic EL medium be at least 1000 Å.

Although the second electrode E2 can be formed of any metal or metals (other than an alkali metal) having a lower (<4.0 eV) work function alone or in combination with one or more higher (>4.0 eV) work function metals, it is preferred that the second electrodes be constructed as taught by Tang et al U.S. Pat. No. 4,885,432, the disclosure of which is here incorporated by reference. In a specifically preferred construction the second electrodes at their interface with the organic EL medium contain at least 50 percent magnesium and at least 0.1 percent (optimally at least 1 percent) of a metal, such as silver or aluminum, having a work function greater than 4.0 eV. As noted above, after the metal has been deposited that forms an interface with the organic EL medium, the second electrodes can be thickened to increase their conductance without decreasing their electron injecting efficiency by depositing any convenient metal. When a higher (>4.0 eV) metal is employed for this purpose the stability of the second electrodes is also increased.

The red and green emitting fluorescent media can be selected from among conventional organic and inorganic fluorescent materials known to absorb blue light and to emit longer wavelength (e.g., green or red) visible light. For example, useful green and red emitting fluorescent media can be selected from among the fluorescent dyes disclosed by Tang et al U.S. Pat. No. 4,769,292, cited above and here incorporated by reference. However, whereas Tang et al contemplates mixing a fluorescent dye and a host material (corresponding to the material forming the blue emitters other than the carbocyclic aromatic compounds noted above) and therefore requires a specific bandgap and reduction potential relationship between the host and fluorescent dye, in the present arrangement the fluorescent dye and blue emitter are in different layers and are optically coupled so that neither the bandgap nor reduction potential relationships required for energy coupling having any applicability and hence an even broader selection of fluorescent dyes is useful. A wide variety of fluorescent dyes that can be stimulated by blue light to emit in the green or red region of the spectrum are known. It is specifically contemplated to form the fluorescent medium of the same same fluorescent materials employed in luminescent solar concentrators in which a dye is used to absorb solar photons and flouresce longer wavelength radiation for more efficient light energy collection. J. S. Batchelder, A. H. Zewail and T. Cole, "Luminescent Solar Concentrators. 2: Experimental and Theoretical Analysis of their Possible Efficiencies", Vol. 20, No. 21, Applied Optics, Nov. 1, 1981, pp. 3733–3754, reviews the properties of a variety of laser dyes when present in poly(methyl methacrylate) as employed in a luminescent solar concentrator. Laser dyes that emit in the green and red portion of the spectrum are specifically contemplated for use as fluorescent materials in the practice of this invention. Specific examples of laser dyes are set out in Shafer Dye Lasers, Chapter 4, "Structure and Properties of Laser Dyes" by K. H. Drexhage, p. 145 et seq., Springer-Verlag, New York, 1977, the disclosure of which is here incorporated by reference.

A specific example of a red emitting fluorescent dye contemplated for use in the practice of this invention is provided by fluorescent 4-dicyano-methylene-4H-pyrans and 4-dicyanomethylene-4H-thiopyrans, hereinafter referred to as fluorescent dicyanomethylene pyran and thiopyran dyes. Preferred fluorescent dyes of this class are those satisfying the following formula:

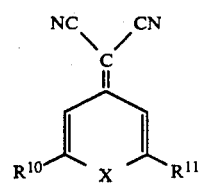

wherein
X represents oxygen or sulfur;
$R^{10}$ represents a 2-(4-aminostyryl) group; and
$R^{11}$ represents a second $R^{10}$ group, an alkyl group, or an aryl group.

Although X most conveniently represents oxygen or sulfur, it is appreciated that higher atomic number chalcogens should provide similar, though bathochromically shifted, response. The amino group can be a primary, secondary or terially amino group. In one specifically preferred form the amino group can form at least one additional fused ring with the styryl phenyl ring. For example, the styryl phenyl ring and the amino group can form a five or six membered ring fused with the styryl phenyl ring. The alkyl group forming $R^{11}$ is preferably phenyl. When both $R^{10}$ and $R^{11}$ form a 2-(4-aminostyryl) group, the groups can be the same or different, but symmetrical compounds are more conveniently synthesized.

The following are illustrative fluorescent dicyanomethylenepyran and thiopyran dyes:

FD-12  4-(Dicyanomethylene)-2-methyl-6-(p-dimethylaminostyryl)-4H-pyran

FD-13  4-(Dicyanomethylene)-2-phenyl-6-[2-(9-julolidyl)ethenyl]-4H-pyran

FD-14  4-(Dicyanomethylene)-2,6-di[2-(9-julolidyl)ethenyl]-4H-pyran

FD-15  4-(Dicyanomethylene)-2-methyl-6-[2-(9-julolidyl)ethenyl]-4H-pyran

FD-16  4-(Dicyanomethylene)-2-methyl-6-[2-(9-julolidyl)ethenyl-4H-thiopyran

In one specific illustrative form the green emitting fluorescent medium can contain any of the green emitting polymethine dyes disclosed by Tang et al U.S. Pat. No. 4,769,292, cited above and here incorporated by reference. The polymethine dyes include cyanines, merocyanines, complex cyanines and merocyanines (i.e., tri-, tetra- and polynuclear cyanines and merocyanines), oxonols, hemioxonols, styryls, merostyryls and streptocyanines. Fluorescence in the green and red portions of the spectrum is favored when the methine linkage between nuclei contains three or more methine groups. To reduce internal energy dissipation and thereby enhance flourescence efficiencies it is preferred that the dyes be rigidized. That is, it is preferred that the dyes contain a bridging linkage in addition to the methine chromophoric linkage joining the nuclei of the chromophore. In addition to the illustrations of polymethine dyes provided by Tang et al U.S. Pat. No. 4,769,292, conventional polymethine dye structures are illustrated by Weissberger and Taylor, Special Topics of Heterocyclic Chemistry, John Wiley and Sons, New York, 1977, Chapter VIII; Venkataraman, The Chemistry of Synthetic Dyes, Academic Press, New York, 1971, Chapter V; James, The Theoxy of the Photographic Process, 4th Ed., Macmillan, 1977, Chapter 8, and F. M. Hamer, Cyanine Dyes and Related Compounds, John Wiley and Sons, 1964. Polymethine dyes with lengthened chromophores, typically at least 5 methine groups joining the chromophoric nuclei, are useful red emitting fluorescent dyes.

When the fluorescent medium contains a fluorescent dye, a convenient fabrication technique is to mix the dye with an easily coated and patterned binder, such a photopolymer. Dye concentration and coating thickness can be controlled to provide the desired level of blue light absorption. The fluorescent material can be dissolved in the binder or can be incorporated in particulate form. The latter is most common when inorganic fluorescent materials are employed. It is preferred that the thicknesses of the fluorescent layers be maintained less than about 10 $\mu$m, since significant light scattering into adjacent pixels can occur as the thickness of the fluorescent medium is increased. For the same reason device constructions are preferred that place the fluorescent media in the closest attainable proximity with the organic EL medium.

The devices 100 and 200 are full color devices--that is, they emit in each of the blue, green and red portions of the spectrum. It is apparent that the same principles of construction can be employed to construct devices having any desired multicolor emission capability. By simply modifying the choices of the materials employed in the luminescent layer LU and/or the fluorescent media a variety of different multicolor emission capabilities are possible. It is also specifically contemplated to construct devices that are capable of emitting only two hues. This is accomplished by dividing each pixel into two sub-pixels instead of three as shown. For example, either the sub-pixel Bp or one of the sub-pixels Gp and Rp can be eliminated in each pixel. The electrode elements addressing pixels in the same column is accordingly reduced from three to two. Conversely, it is possible to increase the number of sub-pixels making up each pixel to four, five, six or even more, although the preferred practice is to employ the minimum number of pixels required to obtain a full color imaging capability.

The invention has been described in terms of preferred embodiments in which the second electrodes are formed in their desired pattern and therefore require no subsequent etching or material removal steps for patterning. Although not preferred, it is recognized that the material forming the second electrodes can be uniformly deposited over the organic EL medium and then patterned by conventional masking and etching techniques. When this approach is taken, the walls 107 and 207 can be omitted, since the sole function of these walls is to pattern the second electrodes.

In addition, it is possible to pattern the organic EL medium so that different emission hues can be obtained from different sub-pixel areas. For example, if the luminescent layer LU is formed of an efficient green emitter, such as aluminum trisoxine or aluminum tris(5-methyloxine), in sub-pixel Gp areas, the G fluorescent medium can be eliminated. The organic EL medium in this modification emits blue light in Bp and Rp sub-pixel areas and green light in Gp subpixel areas. This arrangement reduces some of the patterning required of the organic EL medium, but has the disadvantage that some patterning is still required. This example does, however, demonstrate that the constructions satisfying the requirements of this invention can be hybridized or combined with conventional construction approaches that require patterning of the organic EL medium.

In still another variation of the invention it is contemplated to employ a filter array in combination with the devices of this invention wherein the filter array includes filter domains corresponding to the sub-pixels of the organic EL image display device. Unlike conventional color filter arrays previously described the function of the filter array is not to filter out two thirds of the light it receives. Rather, the function of the individual filter domains is merely to "trim" away trailing edge emissions. For example, if blue emission having a peak wavelength of less than 480 nm is employed, it is still possible for some emission to occur in the green even to extend into the red region of the spectrum. Intercepting the longer wavelengths emitted with a filter domain can reduce total emission by only a small fraction (e.g., less than 10%) and yet have a significant impact on improving hue for full color imaging. In a like manner filter domains can trim green and red emissions to the green and red regions of the spectrum, respectively. For the overwhelming majority of applications emissions from the blue, green and red sub-pixels are satisfactory for full color imaging without any further trimming of the emission profiles.

The invention has been described in detail with particular reference to preferred embodiments thereof, but it will be understood that variations and modifications can be effected within the spirit and scope of the invention.

What is claimed is:

1. An image display device comprised of an array consisting of
   a plurality of light emitting pixels arranged in two intersecting sets of parallel files, the pixels in a first set of parallel files forming columns and the pixels in a second set of parallel files forming rows on an electrically insulative support,
   the pixels in each file of said first set of parallel files containing and being joined by a common light transmissive first electrode means overlying said support,
   the first electrode means in adjacent files of said first set being laterally spaced on said support,
   an organic electroluminescent medium overlying the first electrode means and said support,
   the pixels in each file of said second set of parallel files containing and being joined by a common second electrode means overlying said organic electroluminescent medium, and
   the second electrode means in adjacent files of said second set being laterally spaced on said organic electroluminescent medium,
   characterized in that the device is capable of producing multicolor image display,
   said organic electroluminescent medium emits in the blue region of the spectrum and has a peak emission at a wavelength of less than 480 nm,
   each pixel in said first set of parallel files of pixels is divided into at least two subpixels,
   in said first set one of said first and second electrode means that is contained in and joins the pixels in each file of said first set is divided into at least two laterally spaced electrode elements, each of the electrode elements joining and forming a part of one sub-pixel of each of the pixels in a file, and
   a fluorescent medium located on the upper surface of said support and underlying the first electrode means, and capable of absorbing light emitted by said organic electroluminescent medium and emitting at a longer wavelength is positioned to receive emitted light from said organic electroluminescent medium transmitted through the first electrode means, said fluorescent medium being confined to one sub-pixel of each of the pixels in a file.

2. An image display device according to claim 1 further characterized in that a set of parallel walls overlies the first electrode means and separates adjacent second electrode means.

3. An image display device according to claim 2 further characterized in that
   the first electrode means are arranged in parallel rows,
   each first electrode means joins and forms a part of all of the sub-pixels in a row,
   the second electrode means are arranged in parallel columns,
   each second electrode means is divided into at least two laterally spaced electrode elements,
   a first electrode element of each second electrode means joins and forms a part of one of the sub-pixels of all of the pixels in a column,
   a second electrode element of each second electrode means joins and forms a part of a second of the sub-pixels of all of the pixels in the same column, and
   the walls are laterally located between adjacent columns of sub-pixels.

4. An image display device according to claim 2 further characterized in that
   the second electrode means are arranged in parallel rows,
   each second electrode means joins and forms a part of all of the sub-pixels in a row,
   the first electrode means are arranged in parallel columns,
   each first electrode means is divided into at least two laterally spaced electrode elements,
   a first electrode element of each first electrode means joins and forms a part of one of the sub-pixels of all of the pixels in a column,
   a second electrode element of each first electrode means joins and forms a part of a second of the sub-pixels of all of the pixels in the same column, and
   the walls are laterally located between adjacent rows of pixels.

5. An image display device according to claim 1 further characterized in that the device has a full-color display capability, each of the pixels being divided into three sub-pixels, a first fluorescent medium located on the upper surface of said support and underlying the first electrode means, and capable of absorbing light emitted by said electroluminescent medium and emitting green light is positioned to receive emitted light from said organic electroluminescent medium transmitted through the first electrode means and is confined to one subpixel of each of the pixels in a file, and a second fluorescent medium located on the upper surface of said support and underlying the first electrode means, and capable of absorbing light emitted by said organic electroluminescent medium and emitting red light is positioned to receive emitted light from said organic electroluminescent medium transmitted through the first electrode means and is confined to a second sub-pixel of each of the pixels in the same file.

6. An image display device having full color capability according to claim 5 further characterized in that said organic electroluminescent medium is comprised of a bis (8-quinolinolato) (phenolato) aluminum (III) chelate or a bis(8-quinolinolato)aluminum(III)-$\mu$-oxo-bis(8-quinolinolato)aluminum(III) chelate.

7. An image display device comprised of an array consisting of
   a plurality of light emitting pixels arranged in two intersecting sets of parallel files, the pixels in a first set of parallel files forming columns and the pixels in a second set of parallel files forming rows on an electrically insulative support, the pixels in each file of said first set of parallel files containing and being joined by a common light transmissive first electrode means overlying said support,
   the first electrode means in adjacent files of said first set being laterally spaced on said support, an organic electroluminescent medium overlying the first electrode means and said support, the pixels in each file of said second set of parallel files containing and being joined by a common second electrode means overlying said organic electroluminescent medium, and the second electrode means in adjacent files of said second set being laterally spaced on said organic electroluminescent medium, characterized in that the device is capable of producing full color image display, said organic electroluminescent medium emits in the blue region of the spectrum and has a peak emission at a wavelength of less than 480 nm, each pixel in said first set of parallel files of pixels is divided into three sub-pixels, in said first set one of said first and second electrode means that is contained in and joins the pixels in each file of said first set is divided into three laterally spaced electrode elements, each one of the electrode elements joining and forming a part of one sub-pixel of each of the pixels in a file, one fluorescent medium located on the upper surface of said support and underlying the first electrode means, and capable of absorbing light emitted by said organic electroluminescent medium and emitting green light is positioned to receive emitted light from said organic electroluminescent medium transmitted through the first electrode means and is confined to one sub-pixel of each of the pixels in a file, a second fluorescent medium located on the upper surface of said support and underlying the first electrode means, and capable of absorbing light emitted by said organic electroluminescent medium and emitting red light is positioned to receive emitted light from said organic electroluminescent medium transmitted through the first electrode means and is confined to a second sub-pixel in each of the pixels in the same file, and a set of parallel walls overlying the first electrode means and separating adjacent second electrode means.

8. An image display device according to claim 7 further characterized in that the first electrode means are arranged in parallel rows, each first electrode means joins and forms a part of all of the sub-pixels in a row, the second electrode means are arranged in parallel columns, each second electrode means is divided into at least three laterally spaced electrode elements, a first electrode element of each second electrode means joins and forms a part of one of the sub-pixels of all of the pixels in a column, a second electrode element of each second electrode means joins and forms a part of a second of the sub-pixels of all of the pixels in the same column, a third electrode element of each second electrode means joins and forms a part of a third of the sub-pixels of all of the pixels in the same column, and the walls are laterally located between adjacent columns of sub-pixels.

9. An image display device according to claim 7 further characterized in that the second electrode means are arranged in parallel rows, each second electrode means joins and forms a part of all of the sub-pixels in a row, the first electrode means are arranged in parallel columns, each first electrode means is divided into at least three laterally spaced electrode elements, a first electrode element of each first electrode means joins and forms a part of one of the sub-pixels of all of the pixels in a column, a second electrode element of each first electrode means joins and forms a part of a second of the sub-pixels of all of the pixels in the same column, a third electrode element of each first electrode means joins and forms a part of a third of the sub-pixels all of the pixels in the same column, and the walls are laterally located between adjacent rows of pixels.

10. An image display device according to claim 7 further characterized in that said organic electroluminescent medium is comprised of a bis(8-quinolinolato)(phenolato)aluminum (III) chelate or a bis(8-quinolinolato)aluminum(III)-$\mu$-oxobis(8-quinolinolato)aluminum(III) chelate.

11. An image display device according to claim 10 further characterized in that said organic electroluminescent medium contains an electron injecting layer containing an aluminum trisoxine in contact with the second electrode means.

* * * * *